United States Patent [19]
Deckers et al.

[11] Patent Number: 5,952,864
[45] Date of Patent: *Sep. 14, 1999

[54] INTEGRATABLE CIRCUIT CONFIGURATION FOR STABILIZING THE OPERATING CURRENT OF A TRANSISTOR BY NEGATIVE FEEDBACK, BEING SUITABLE IN PARTICULAR FOR BATTERY-OPERATED DEVICES

[75] Inventors: Margarete Deckers; Lothar Musiol, both of München; Klaus-Jürgen Schoepf, Ismaning, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/601,329

[22] Filed: Feb. 16, 1996

[30] Foreign Application Priority Data

Feb. 16, 1995 [DE] Germany ............. 195 05 269

[51] Int. Cl.⁶ ........................... G05F 1/46
[52] U.S. Cl. ................ 327/313; 327/483; 327/565
[58] Field of Search ............ 327/331, 332, 327/378, 362, 363, 325, 327, 312, 313, 314, 483, 595, 504, 309, 80, 73, 538, 540, 564, 565

[56] References Cited

U.S. PATENT DOCUMENTS

| | | |
|---|---|---|
| 3,702,947 | 11/1972 | Schilling . |
| 3,956,661 | 5/1976 | Sakamoto et al. .............. 327/538 |
| 3,978,350 | 8/1976 | Fletcher et al. ................ 327/483 |
| 4,028,564 | 6/1977 | Streit et al. .................... 327/540 |
| 4,030,023 | 6/1977 | Keith ............................. 327/540 |
| 4,119,869 | 10/1978 | Hashimoto . |
| 4,323,792 | 4/1982 | Bergmann et al. ............. 327/314 |
| 4,481,430 | 11/1984 | Houk et al. .................... 327/540 |
| 4,613,768 | 9/1986 | Pommer, II .................... 327/80 |
| 4,945,396 | 7/1990 | Shigekane et al. ............ 327/483 |
| 5,184,036 | 2/1993 | Kesler et al. .................. 327/309 |

FOREIGN PATENT DOCUMENTS

| | | |
|---|---|---|
| 0 509 285 A1 | 10/1992 | European Pat. Off. . |
| 20 51 536 | 4/1972 | Germany . |
| 27 05 276 C2 | 9/1977 | Germany . |

OTHER PUBLICATIONS

Sedra et al., "Microelectronic Circuits", 3rd ed., pp. 675–676, 1991.
"Basic Circuits of the Analogous Integrated Technology", (Kröbel), 1978, pp. 621–691.
"Semi–Conductor Switching Technology" (Tietze et al.), 4th edition, Springer Publishers, Berlin, 1978, pp. 56–59.
"Electrical Features of Linear Integrated Circuits" (Goerth), Valvo Construction Elements for Electronics pp. 34–55.
IBM Technical Disclosure Bulletin, vol. 32, No. 2, Jul. 1989, p. 61.
Elemente der angewandten Elektronik, (E. Boehmer) 9th Edition, Vieweg–Verlag, Braunschweig, Germany, 1994.

*Primary Examiner*—Timothy P. Callahan
*Assistant Examiner*—Eunja Shin
*Attorney, Agent, or Firm*—Herbert L. Lerner; Laurence A. Greenberg

[57] ABSTRACT

An integratable circuit configuration for stabilizing an operating point of a transistor by negative feedback includes first, second, third and fourth terminals. The fourth terminal is connected to a fixed ground potential, and the first and fourth terminals have a supply voltage source connected therebetween. A first transistor to be stabilized by negative feedback has a collector connected to the second terminal, an emitter connected to the fourth terminal, and a base connected to the third terminal. A second transistor has an emitter connected to the second terminal, a collector connected to the third terminal, and a base. A first resistor is connected between the first terminal and the second terminal. A second resistor is connected between the base of the second transistor and the fourth terminal. A series circuit has at least one first diode and one second diode and is connected between the first terminal and the base of the second transistor.

1 Claim, 4 Drawing Sheets

PRIOR ART
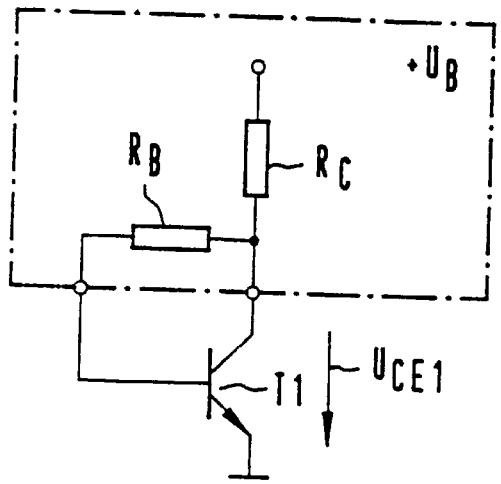
FIG 5
PRIOR ART
FIG 6b
PRIOR ART
FIG 6a
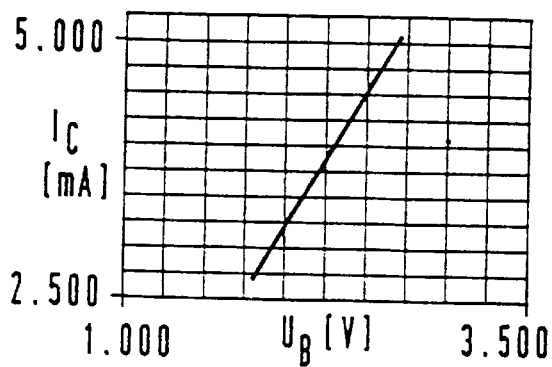
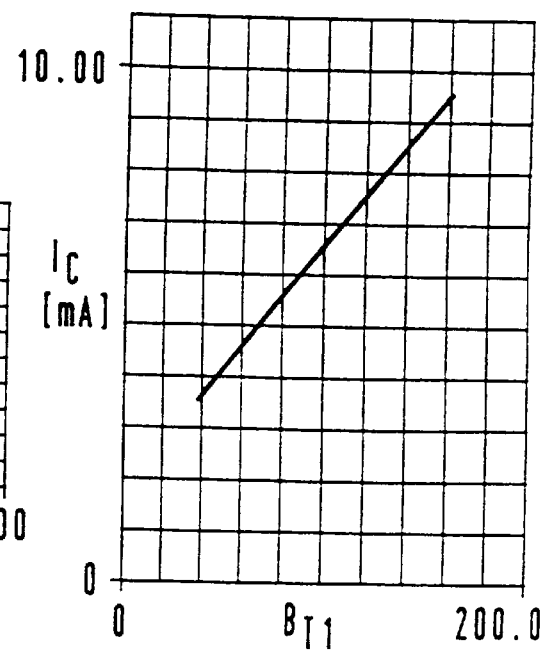

INTEGRATABLE CIRCUIT CONFIGURATION FOR STABILIZING THE OPERATING CURRENT OF A TRANSISTOR BY NEGATIVE FEEDBACK, BEING SUITABLE IN PARTICULAR FOR BATTERY-OPERATED DEVICES

BACKGROUND OF THE INVENTION

FIELD OF THE INVENTION

The invention relates to a circuit configuration for stabilizing the operating current of a transistor by negative feedback.

Such circuit configurations are described, for instance, in the publication entitled: Elemente der angewandten Elektronik [Elements of Applied Electronics], by E. Bohmer, 9th Edition, Vieweg-Verlag, Braunschweig, Germany, 1994, and are known in the form of parallel negative feedback or series negative feedback.

Examples of negative feedback are described in more detail below with regard to FIGS. 5, 6a and 6b.

With series negative feedback, it is true that better operating current stabilization can be accomplished in the presence of a fluctuating supply voltage or a departure of a current amplification from a rated value. However, it has the substantial disadvantage that a voltage which must additionally be supplied by the supply voltage source drops at the resistor connected to the emitter supply line. However, in view of the prevailing development in electronic devices to ever-lower supply voltages that is undesirable.

SUMMARY OF THE INVENTION

It is accordingly an object of the invention to provide an integratable circuit configuration for stabilizing the operating current of a transistor by negative feedback, that is suitable in particular for battery-operated devices, which overcomes the hereinafore-mentioned disadvantages of the heretofore-known devices of this general type and which assures a high operating current stability of the transistor to be regulated, even when the supply voltage is low, in the event of temperature fluctuations, departures of a current amplification of the transistor to be regulated from a rated value, and fluctuations in a supply voltage.

With the foregoing and other objects in view there is provided, in accordance with the invention, an integratable circuit configuration for stabilizing an operating point of a transistor by negative feedback, comprising first, second, third and fourth terminals, the fourth terminal being connected to a fixed ground potential, and the first and fourth terminals having a supply voltage source connected therebetween; a first transistor to be stabilized by negative feedback, the first transistor having a collector connected to the second terminal, an emitter connected to the fourth terminal, and a base connected to the third terminal; a second transistor having an emitter connected to the second terminal, a collector connected to the third terminal, and a base; a first resistor connected between the first terminal and the second terminal; a second resistor connected between the base of the second transistor and the fourth terminal; and a series circuit having at least one first diode and one second diode and being connected between the first terminal and the base of the second transistor.

In accordance with another feature of the invention, the second transistor, the series circuit and the second resistor are integrated on one and the same chip.

In accordance with a further feature of the invention, the first resistor is also integrated on the same chip.

In accordance with an added feature of the invention, the first transistor is also integrated on the same chip.

In accordance with a concomitant feature of the invention, there is provided a substrate of a first conduction type and a surface; a first well of a second conduction type forming the first resistor; a second well of the first conduction type and a third well of the second conduction type being embedded in the second well for forming the first diode, and a fourth well of the second conduction type in which the first diode is embedded; a fifth well of the first conduction type and a sixth well of the second conduction type being embedded in the fifth well for forming the second diode, and a seventh well of the second conduction type in which the second diode is embedded; an eighth well of the second conduction type, a ninth well of the first conduction type being embedded in the eighth well and the substrate, forming the second transistor; a tenth well of the first conduction type forming the second resistor, and an eleventh well of the second conduction type in which the tenth well is embedded; and the second well and the fourth well forming a pn junction and the fifth well and the seventh well forming a pn junction, being short-circuited at the surface.

Besides excellent operating current stabilization, the circuit configuration has the advantage of being able to be integrated on a chip and mounted in an SMD housing in an especially economical way.

Other features which are considered as characteristic for the invention are set forth in the appended claims.

Although the invention is illustrated and described herein as embodied in an integratable circuit configuration for stabilizing the operating current of a transistor by negative feedback, which is suitable in particular for battery-operated devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a circuit diagram showing a basic type of parallel negative feedback; and FIGS. 6a and 6b are diagrams showing changes in an operating current.

DESCRIPTION OF THE PREFERRED EMBODIMENTS

Figure 1:
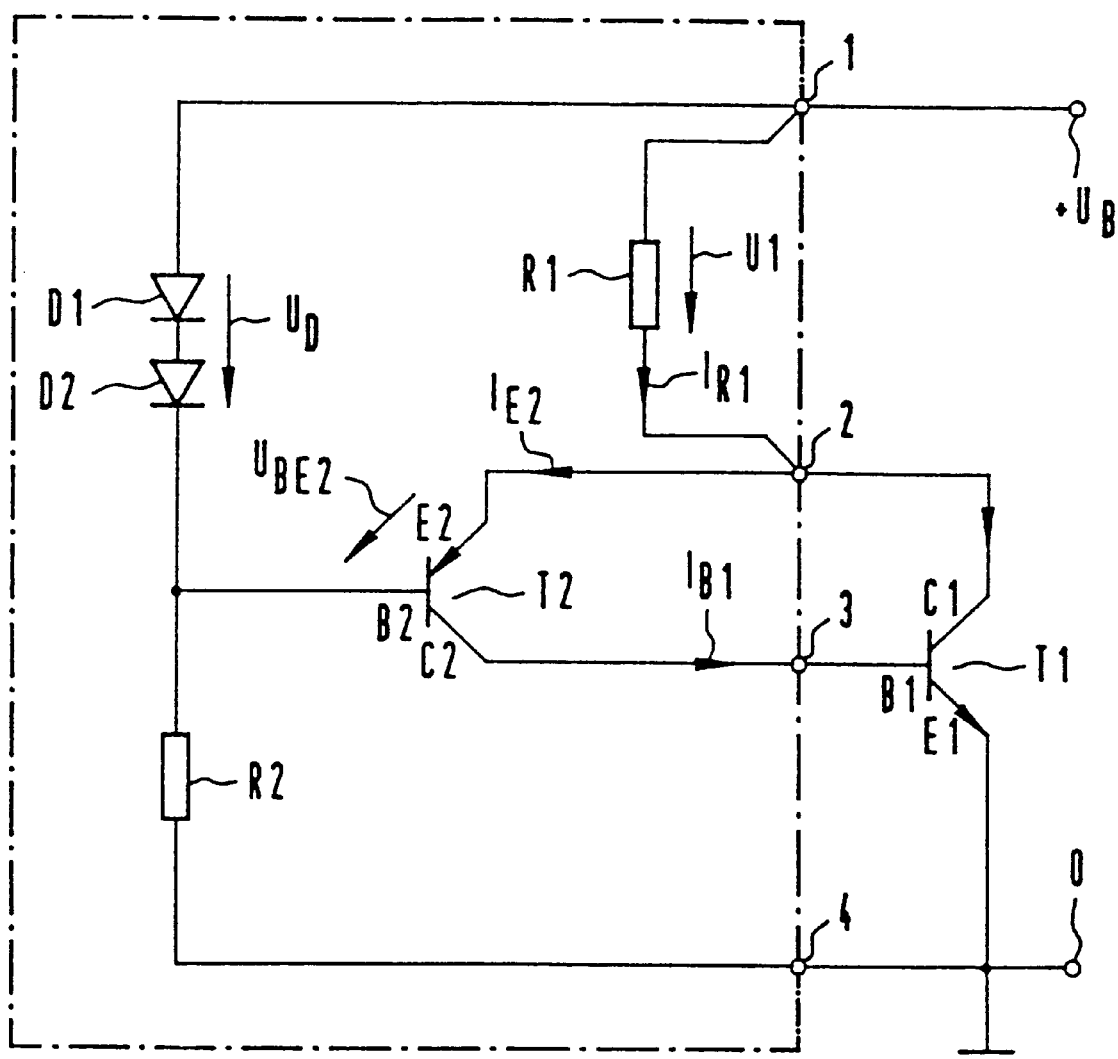
FIG. 1 is a schematic circuit diagram of a configuration according to the invention.

Referring now to the figures of the drawing in detail and first, particularly, to FIG. 5 thereof, there is seen a basic type of parallel negative feedback. A resistor $R_B$ is connected parallel to a collector-to-base path of a transistor (T1) to be regulated. A temperature-dictated increase, for instance, in an operating current $I_{C1}$ causes a drop in a collector-to-emitter voltage $U_{CE1}$ and simultaneously a drop in a base current $I_{B1}$, which has the effect of an inverse control.

In a series negative feedback, a resistor is connected in an emitter supply line. A base potential is adjusted through a voltage divider. In the case of a temperature-dictated rise in the operating current, an emitter potential is raised, and as a result a base-to-emitter voltage and thus in turn the base current are lowered.

Besides temperature fluctuations, fluctuations in a supply voltage $U_B$ and a deviation, caused by unavoidable production variation from a rated value, in the current amplification of the transistor to be regulated, can also cause a departure of the operating current from the desired value.

Fluctuations in the supply voltage $U_B$ are unavoidable, especially in battery-operated electronic devices. However, in view of the increasingly wide use of mobile electronic devices, such as the car phone and the laptop computer, battery operation is gaining more and more importance. In the construction of electronic circuits, fluctuations in the supply voltage $U_B$ must therefore be taken into account to a greater extent. Moreover, mobile electronic devices in general are exposed to major fluctuations in ambient temperature.

Both in the case of fluctuations in the supply voltage $U_B$ and of deviations in the current amplification B from the rated value, the often-used parallel negative feedback assures only an inadequate stabilization of the operating current. In both cases, significant changes in the operating current occur. The diagrams shown in FIGS. 6a and 6b document that fact. They illustrate the dependency of the operating current on the supply voltage $U_B$ and on the current amplification FIG. 1 shows an npn transistor T1 to be controlled in a circuit configuration of the invention. An E1 emitter of the transistor T1 is applied to a fixed potential, such as ground, and is connected to a terminal 4. A base B1 of the transistor T1 is connected to a terminal 3, and a collector C1 of the transistor T1 is connected to a terminal 2. A pnp transistor T2 has a collector C2 connected to the terminal 3 and an emitter E2 connected to the terminal 2. A resistor R1 is connected between a terminal 1 and the emitter E2 of the transistor T2. A series circuit of a diode D1 and a diode D2 is connected between a base B2 of the transistor T2 and the terminal 1. A resistor R2 is connected between the base B2 of the transistor T2 and the terminal 4. The circuit configuration is connected to a supply voltage $U_B$, for instance a battery voltage, through the terminal 1 and the terminal 4.

The especially advantageous mode of operation of this circuit configuration is based on the current-determining mesh, including the series circuit of the two diodes D1 and D2, the resistor R1, and the emitter-to-base path of the transistor T2. Specifically, regardless of the magnitude of the operating voltage $U_B$ and regardless of a current amplification $B_{T1}$ of the transistor T1, a virtually constant voltage $U_D$ of approximately 1.3 V is present at the series circuit of the diodes D1 and D2. A virtually constant voltage $U_{BE2}$ of approximately 0.65 V is likewise present at the emitter-to-base path of the transistor T2. Thus a voltage U1 at the resistor R1 is defined as approximately 0.65 V, and consequently a current $I_{R1}$ through the resistor R1 is also defined as $I_{R1} \approx 0.65$ V/R1.

The current $I_{R1}$ is the sum of the operating current $I_{C1}$ of the transistor T1 to be stabilized and the emitter current $I_{E2}$ of the transistor T2. At a current amplification $B_{T1}$ of the transistor T1 that is greater than 40, the base current $I_{B1}$ of the transistor T1 and thus the emitter current $I_{E2}$ of the transistor T2 are negligibly small as compared with the operating current $I_{C1}$ of the transistor T1. It is thus true that $I_{C1} \approx 0.65$ V/R1.

In the event of a variation in the supply voltage $U_B$, the voltage $U_D$ at the series circuit of the diodes D1 and D2 remains virtually constant, because of the exponential diode characteristic. For the same reason, the base-to-emitter voltage $U_{BE2}$ of the transistor T2 remains virtually constant as well. Thus the voltage U1 at the resistor R1 also hardly varies, so that the operating current $I_{C1}$ of the transistor $T_1$ remains virtually constant as well.

In the event of a production-dictated deviation in the current amplification $B_{T1}$ of the transistor T1 from the rated value, the operating current $I_{C1}$ of the transistor T1 also remains virtually unchanged. Lesser or greater current amplifications $B_{T1}$ change the emitter current $I_{E2}$ of the transistor T2 and thus also the base current $I_{B1}$ of the transistor T1 in such a way that in both cases an inverse control occurs. For instance, if the actual current amplification $B_{T1}$ of the transistor T1 is greater than the rated value, the operating current $I_{C1}$ of the transistor T1 rises with a simultaneous reduction in the emitter current $I_{E2}$, since the current $I_{R1}$ through the resistor R1 remains constant. The resultant decrease in the base current $I_{B1}$ of the transistor T1 causes a drop in the operating current $I_{C1}$.

In the event of temperature fluctuations, the current amplification $B_{T1}$ of the transistor T1 varies, on one hand. On the other hand, the voltages $U_D$ and $U_{BE2}$ vary by several millivolts. This is the result of voltage changes at the pn junctions of the series circuit of the two diodes D1 and D2 and of the emitter-to-base path of the transistor T2. However, for the reasons given above, a change in the current amplification $B_{T1}$ of the transistor T1 remains virtually without any consequences. The effect of the voltage change at the pn junctions is compensated for, for one of the diodes D1 and D2, by the pn junction of the emitter-to-base path of the transistor T2. What remains left over is the change in voltage of one diode, but this is compensated for by a suitable temperature characteristic of the resistor R1. The influence of temperature on the remaining components of the circuit configuration is insignificant, because it does not affect the current-determining mesh including the two diodes D1 and D2, the resistor R1, and the emitter-to-base path of the transistor T2.

Figure 2:
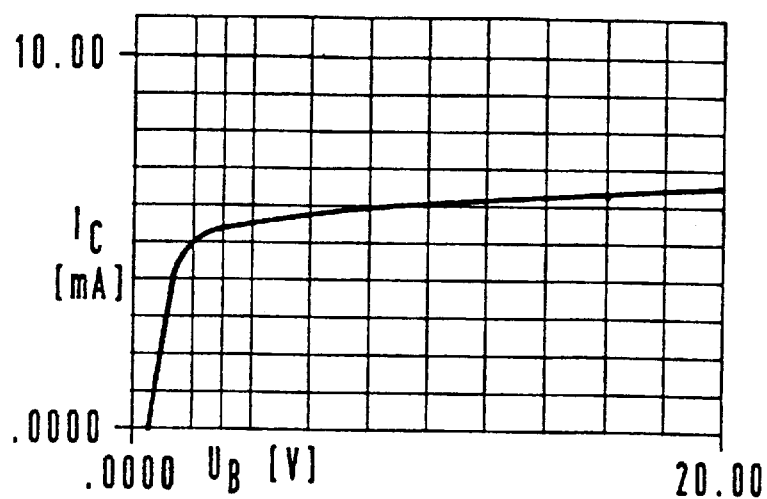
FIG. 2 is a diagram showing a control behavior of the circuit configuration of the invention in the presence of a varying supply voltage $U_B$.
Figure 3:
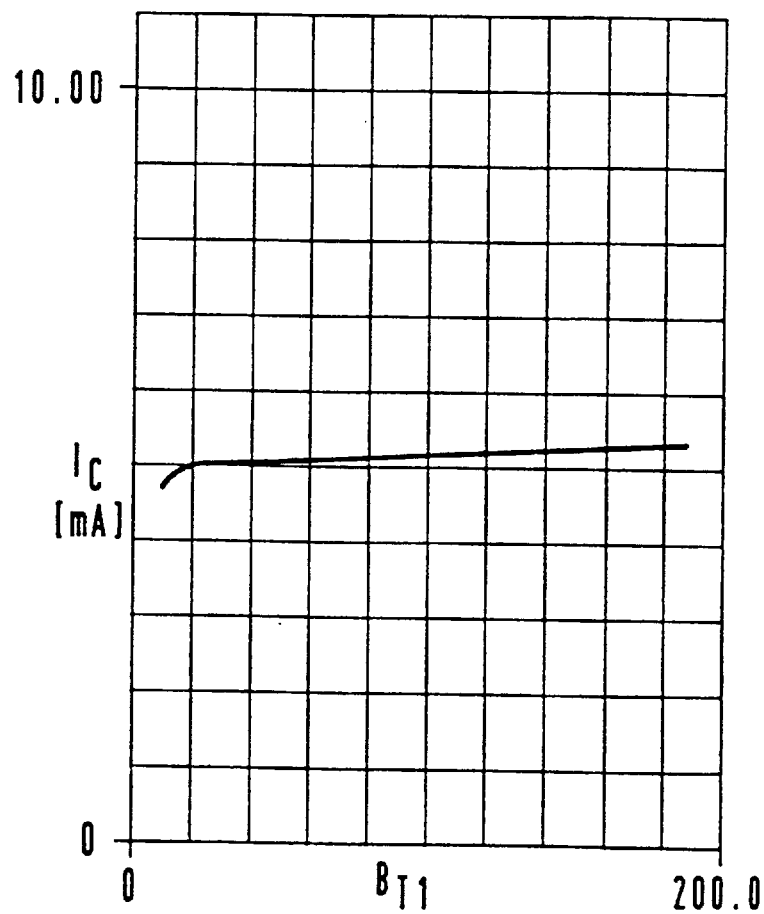
FIG. 3 is a diagram showing a control behavior of the circuit configuration of the invention in the presence of a varying current amplification $B_{T1}$ of a first transistor T1.

In order to illustrate the above-described control behavior of the circuit configuration of FIG. 1, FIGS. 2 and 3 show the control behavior of the circuit configuration in the presence of a varying supply voltage $U_B$ or a varying current amplification $B_{T1}$ of the transistor T1, in the form of graphs. FIG. 2 shows the operating current $I_{C1}$ as a function of the level of the supply voltage $U_B$, and FIG. 3 shows the operating current $I_{C1}$ as a function of the current amplification $B_{T1}$ of the transistor $T_1$. Upon comparison with the diagrams of FIG. 6, a marked improvement in the control behavior as compared with the parallel negative feedback is evident.

The circuit configuration of FIG. 1 affords the possibility of connecting one additional external resistor between the terminal 1 and the terminal 2. This allows a very accurate individual adjustment of the operating current $I_{C1}$ of the first transistor T1.

The circuit configuration of FIG. 1 can be integrated on one chip, as needed with or without the resistor R1 and with or without the transistor T1. An especially simple and economical technology with a low number of process steps can be employed for integration. In the event that the resistor R1 is omitted from the integrated circuit, then the resistor R1 should be connected externally between the terminal 1 and the terminal 2, in order to maintain the function of the circuit configuration.

Figure 4:
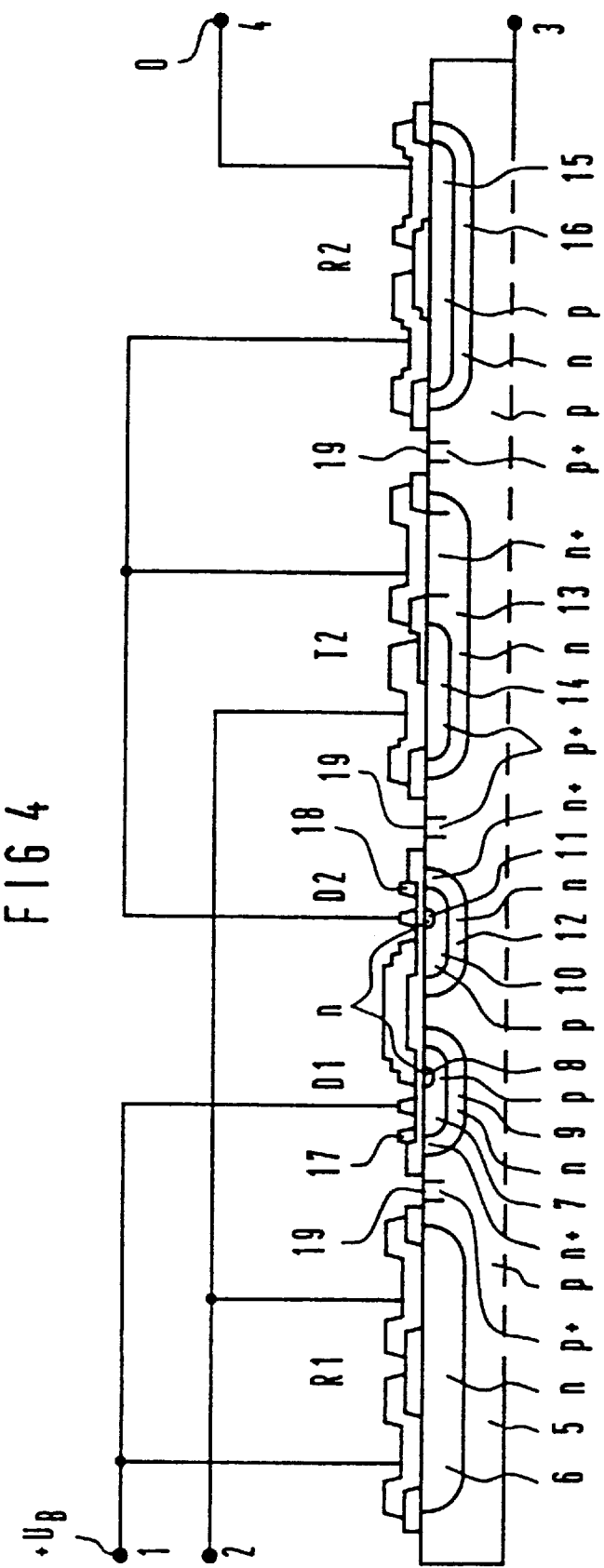
FIG. 4 is a cross-sectional view of a possible structure of the integrated circuit of the configuration of the invention.

FIG. 4 shows a diagrammatic cross section through an exemplary embodiment of an integrated layout of the circuit configuration of FIG. 1 without the transistor T1. Beginning at a p-conducting substrate 5, the components of the circuit configuration are constructed in separate n-conducting wells. The resistor R1 includes an n-conducting first well 6. The diode D1 is composed of a p-conducting second well 7 and an n-conducting third well 8 embedded therein and is embedded in an n-conducting fourth well 9. Analogously, the diode D2 is composed of a p-conducting fifth well 10 and an n-conducting sixth well 11 embedded therein, and is embedded in an n-conducting seventh well 12. A pn junction formed by the well 7 and the well 9 and a pn junction formed by the well 10 and the well 12 are short-circuited at the surface. An n-conducting eighth well 13, a p-conducting ninth well 14 embedded therein, and the p-conducting substrate 5 form the transistor T2. A p-conducting tenth well 15, which is embedded in an n-conducting eleventh well 16, forms the resistor R2. A p-conducting guard ring 19 is disposed between the individual components.

The embedding of each of the diodes D1 and D2 in an n-conducting well has the effect of polarizing a pn junction in the depletion direction both with a positive and with a negative voltage between the diode terminals and the underside of the chip. For the same reason, the resistor R2 is also constructed in the form of a p-conducting well embedded in an n-conducting well. The short-circuiting of the pn junction formed by the well 7 and by the well 9 and of the pn junction formed by the well 10 and the well 12 prevent ignition of the parasitic thyristor constructed at each diode.

The method for producing the above-described integrated circuit of FIG. 4 is especially advantageously distinguished by a low number of process steps. The first resistor R1, the n-conducting well 9, the n-conducting well 12, the base B2 (n-conducting well 13) of the transistor T2 and the n-conducting well 16 are structured and doped in one step. Next, in a like manner and in a single step, the p-conducting well 7, the p-conducting well 10, the emitter E2 (p-conducting well 14) of the transistor T2 and the p-conducting guard ring 19 are structured and doped.

We claim:

1. An integratable circuit configuration for stabilizing an operating point of a transistor by negative feedback, comprising:

a) first, second, third and fourth terminals, said fourth terminal being connected to a fixed ground potential, and said first and fourth terminals having a supply voltage source connected therebetween;

b) a first transistor to be stabilized by negative feedback, said first transistor having a collector connected to said second terminal, an emitter connected to said fourth terminal, and a base connected to said third terminal;

c) a second transistor having an emitter connected to said second terminal, a collector connected to said third terminal, and a base;

d) a first resistor connected between said first terminal and said second terminal;

e) a second resistor connected between the base of said second transistor and said fourth terminal;

f) a series circuit having at least one first diode and one second diode and being connected between said first terminal and the base of said second transistor;

wherein said second transistor, said series circuit, said first resistor and said second resistor are integrated on one chip, wherein said chip includes:

a) a substrate of a first conduction type and a surface;

b) a first well of a second conduction type forming said first resistor;

c) a second well of the first conduction type and a third well of the second conduction type being embedded in said second well for forming said first diode, and a fourth well of the second conduction type in which said first diode is embedded;

d) a fifth well of the first conduction type and a sixth well of the second conduction type being embedded in said fifth well for forming said second diode, and a seventh well of the second conduction type in which said second diode is embedded;

e) an eighth well of the second conduction type, a ninth well of the first conduction type being embedded in said eighth well and said substrate, forming said second transistor;

f) a tenth well of the first conduction type forming said second resistor, and an eleventh well of the second conduction type in which said tenth well is embedded; and g) said second well and said fourth well forming a pn junction and said fifth well and said seventh well forming a pn junction, being short-circuited at said surface.

* * * * *